(12) United States Patent
Irino

(10) Patent No.: US 7,495,872 B2
(45) Date of Patent: Feb. 24, 2009

(54) SEMICONDUCTOR UNIT

(75) Inventor: Hitoshi Irino, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 244 days.

(21) Appl. No.: 11/285,157

(22) Filed: Nov. 23, 2005

(65) Prior Publication Data

US 2006/0114047 A1 Jun. 1, 2006

(30) Foreign Application Priority Data

Nov. 26, 2004 (JP) .............................. 2004-342474

(51) Int. Cl.
*H02H 9/00* (2006.01)

(52) U.S. Cl. .................... 361/54; 361/100; 327/389; 327/525

(58) Field of Classification Search .................. None
See application file for complete search history.

(56) References Cited

U.S. PATENT DOCUMENTS

| | | | | |
|---|---|---|---|---|
| 5,255,146 A | * | 10/1993 | Miller | 361/56 |
| 5,387,823 A | * | 2/1995 | Ashizawa | 326/13 |
| 5,604,655 A | * | 2/1997 | Ito | 361/56 |
| 5,679,971 A | | 10/1997 | Tamba et al. | |
| 5,784,235 A | * | 7/1998 | Otomo et al. | 361/56 |
| 5,838,146 A | * | 11/1998 | Singer | 323/270 |
| 5,886,558 A | | 3/1999 | Iijima et al. | |
| 6,034,854 A | * | 3/2000 | Suga | 361/56 |
| 6,078,083 A | * | 6/2000 | Amerasekera et al. | 257/358 |
| 7,123,054 B2 | * | 10/2006 | Satou et al. | 326/82 |
| 7,154,724 B2 | * | 12/2006 | Wu et al. | 361/91.1 |
| 2002/0057618 A1 | * | 5/2002 | Yamagata et al. | 365/226 |
| 2004/0247036 A1 | * | 12/2004 | Hedberg et al. | 375/257 |
| 2005/0047042 A1 | * | 3/2005 | Satou et al. | 361/100 |
| 2005/0088396 A1 | * | 4/2005 | Tobita | 345/100 |
| 2005/0213274 A1 | * | 9/2005 | Wu et al. | 361/91.1 |
| 2006/0114047 A1 | * | 6/2006 | Irino | 327/328 |

FOREIGN PATENT DOCUMENTS

| | | |
|---|---|---|
| JP | 8-37238 A | 2/1996 |
| JP | 9-172146 A | 6/1997 |

* cited by examiner

*Primary Examiner*—David E Graybill
(74) *Attorney, Agent, or Firm*—Sughrue Mion, PLLC

(57) ABSTRACT

To improve the ESD protection of a circuit receiving a signal. An inverter circuit INV1 is connected to ground wiring GND1 for supplying power, and is connected to power supply wiring VDD1 via a PMOS transistor MP5. An inverter circuit INV2 is connected to ground wiring GND2 and power supply wiring VDD2 for supplying power, and its input node is connected to an output node of the inverter circuit INV1. Further, the ground wiring GND1 and the ground wiring GND2 are connected via a protection element PE0. During normal operation, the output of an inverter circuit INV3 goes to an H level, the output of an inverter circuit INV4 goes to an L level, and the PMOS transistor MP5 is turned on. When ESD is applied, the power supply wiring VDD2 is place in a floating state, the output of the inverter circuit INV4 goes to an H level, the PMOS transistor MP5 is turned off, and a current that occurs when EDS is applied does not flow into the inverter circuit INV2.

19 Claims, 13 Drawing Sheets

SEMICONDUCTOR UNIT

FIELD OF THE INVENTION

The present invention relates to a semiconductor unit and particularly a semiconductor unit that comprises a protection circuit against electrostatic discharge (ESD) flowing from a power supply system.

BACKGROUND OF THE INVENTION

In recent years, as semiconductor units have become more and more multifunctional, an increasing number of semiconductor units have multiple power supply systems within a single semiconductor unit where multiple circuits are divided and disposed so that each circuit is connected to a respective power supply system. Multiple power supply systems are provided when: (1) a single semiconductor unit uses multiple power supply voltages; (2) both analog circuits and digital circuits are used, and noisy digital power supply and ground (GND) need to be separated from analog power supply and ground (GND); (3) a temporarily unused circuit is turned off in order to save energy, and the power supply for this circuit needs to be separated from the power supply for circuits used all the time.

Next, such a semiconductor unit, where circuits belonging to multiple power supply systems are interconnected, will be described. FIG. 12 is a circuit block diagram of a conventional semiconductor unit where signals are sent/received between circuits belonging to different power supply systems (refer to Patent Document 1). In FIG. 12, a first circuit connected to a first power supply system comprises a power supply terminal V11 and a ground terminal G11, and a second circuit connected to a second power supply system comprises a power supply terminal V12 and a ground terminal G12. The ground terminal G11 and the ground terminal G12 are connected via a protection element PE10. Further, an ESD protection element PE11 is connected between the power supply terminal V11 and the ground terminal G11, and an ESD protection element PE12 is connected between the power supply terminal V12 and the ground terminal G12. The first circuit comprises subordinately connected PMOS transistor MP11 and NMOS transistor MN11. Further, the second circuit comprises subordinately connected PMOS transistor MP12 and NMOS transistor MN12.

During normal operation, the PMOS transistor MP11 and the NMOS transistor MN11 included in the first circuit send a signal to the PMOS transistor MP12 and the NMOS transistor MN12 included in the second circuit. In other words, the drains of the PMOS transistor MP11 and the NMOS transistor MN11 are common and connected to the interconnected gates of the PMOS transistor MP12 and the NMOS transistor MN1.

When ESD is applied, such as during an ESD test, assuming that the ground terminal G12 is grounded and a positive electric charge is applied to the power supply terminal V11, first, the electric charge injected into the power supply terminal V11 by ESD application is discharged to ground wiring GND11 connected to the ground terminal G11 primarily through the ESD protection element PE11, and it is then discharged to ground wiring GND12 via the ground wiring GND11 (a path P11.) In this case, it is ideally preferable that a resistance component parasitic on the connection between power supply wiring VDD11 and the ground wiring GND11, and between the ground wiring GND11 and the ground wiring GND12 be as close to zero as possible, and that a voltage drop that occurs when a current flows by applying ESD be almost zero. However, in reality, since the parasitic resistances of the ESD protection element, the power supply wiring VDD11, the ground wiring GND11, and the ground wiring GND12 exist, the potential of the power supply wiring VDD11 increases as the current flows by applying ESD. Moreover, since long distance wiring is provided, and in some cases, the protection element PE10 and a resistance element are inserted between the ground wiring GND11 and the ground wiring GND12, there are parasitic resistance components of the wiring and the inserted elements in the path where the current flows from the ground wiring GND11 to the ground wiring GND12. Therefore, the potential of the power supply wiring VDD11 is more likely to increase compared to the cases where electricity is discharged from the power supply wiring VDD11 to the ground wiring GND11 or from the power supply wiring VDD11 to the ground wiring GND12.

Meanwhile, when ESD is being applied, everything is floating except for the application pin and ground pin. When ESD is applied to the power supply terminal V11, the potentials of the gate electrodes of the PMOS transistor MP11 and NMOS transistor MN11 are floating, and the PMOS transistor MP11 is in an on state. In this state, the electric charge applied to the power supply terminal V11 is charged in the gate of the NMOS transistor MN12 through the PMOS transistor MP11 (a path P12). As mentioned before, the ground terminal G12 is grounded, therefore the maximum voltage amount that can be applied between the gate and the source/sub of the NMOS transistor MN12 is the voltage between the power supply wiring VDD11 and the ground wiring GND12.

As described above, since the current flows through multiple elements, the potential of the power supply wiring VDD11 increases and the voltage between the power supply wiring VDD11 and the ground wiring GND12 is directly applied to the gate oxide film of the NMOS transistor MN12. As a result, the NMOS transistor MN12 might get damaged. An operation where the ground terminal G12 is grounded and ESD is applied to the power supply terminal V11 was described here, however, when the power supply terminal V12 is grounded and ESD is applied to the power supply terminal V11, the PMOS transistor MP12 might get damaged in a similar operation. In the latest LSI manufacturing process, miniaturization and voltage reduction is advanced, and the breakdown voltage of the gate oxide films of the NMOS transistor MN12 and the PMOS transistor MP12 is getting lower and lower. Therefore, when ESD is applied between different power supply systems as described above, it is easy for the gate oxide film to be damaged by a low voltage.

As a measure to protect against such a damage, as shown in FIG. 13, an NMOS transistor MN13 as a gate protection element to protect the NMOS transistor MN12 and the PMOS transistor MP12 can be inserted (refer to Patent Document 2 for example). The NMOS transistor MN13 is turned off during normal operation and does not influence the signal transmission where the PMOS transistor MP11 and the NMOS transistor MN11 send a signal to the PMOS transistor MP12 and the NMOS transistor MN12. When ESD is applied, for instance, when the ground terminal G12 is grounded and ESD is applied to the power supply terminal V11, the electric charge of the ESD is charged in the gate of the NMOS transistor MN12 through the PMOS transistor MP11, and the NMOS transistor MN13 is turned on as soon as the gate potential of the NMOS transistor MN12 increases. Since the potential is limited so that the gate potential of the NMOS transistor MN12 will not surpass a predetermined value, the protection against ESD is improved, compared to the circuit shown in FIG. 12.

[Patent Document 1]
Japanese Patent Kokai Publication No. JP-A-9-172146 (FIG. 1)

[Patent Document 2]
Japanese Patent Kokai Publication No. JP-A-8-37238 (FIG. 7)

SUMMARY OF THE DISCLOSURE

However, the more the parasitic resistance of the path P11, which is the path of the current discharged through the ESD protection element PE11 (i.e., a path from the power supply terminal V11 to the ground wiring GND11 via the ESD protection element 11, and a path from the ground wiring GND11 to the ground wiring GND12), increases and the wider the gate width of the PMOS transistor MP11 gets, the more a current flowing in the NMOS transistor MN13 in FIG. 13 (a path P13) increases. Therefore, depending on certain circuit conditions such as a large parasitic resistance, a current larger than the NMOS transistor MN13 can withstand flows in it, damaging the NMOS transistor MN13 itself.

The present inventor has realized that the above-described problem can be solved by a structure where a current that occurs when ESD is applied does not flow into circuits on the input side from circuits on the output side, and invented the present invention.

A semiconductor unit relating to a first aspect of the present invention comprises: a circuit that detects a surge flowing into wiring of power source supplied externally and that cuts off the connection between a power supply path to an internal circuit and a signal output path from the internal circuit.

A semiconductor unit relating to a second aspect of the present invention comprises: a first circuit receiving power from a first power supply and having an output node; a second circuit having an input node connected to the output node; and a first switching element, inserted in a path from the power supply wiring of the first power supply through the output node to the input node and short circuited during normal operation, provided that the first switching element detects a surge flowing into the first power supply and cuts off the path.

A semiconductor unit relating to a third aspect of the present invention comprises: a first circuit receiving power from a first power supply and having an output node; a second circuit receiving power from a second power supply and having an input node connected to the output node; and a first switching element, inserted in a path from the power supply wiring of the first power supply through the output node to the input node and short circuited during normal operation, provided that the first switching element opens when either the power supply wiring of the second power supply or ground wiring is placed in a floating state.

The meritorious effects of the present invention are summarized as follows.

According to the present invention, a switching element stops a current that occurs when ESD is applied from flowing from the output side to the input side, therefore the ESD protection of the circuit receiving a signal is improved.

PREFERRED EMBODIMENTS OF THE INVENTION

Figure 1:
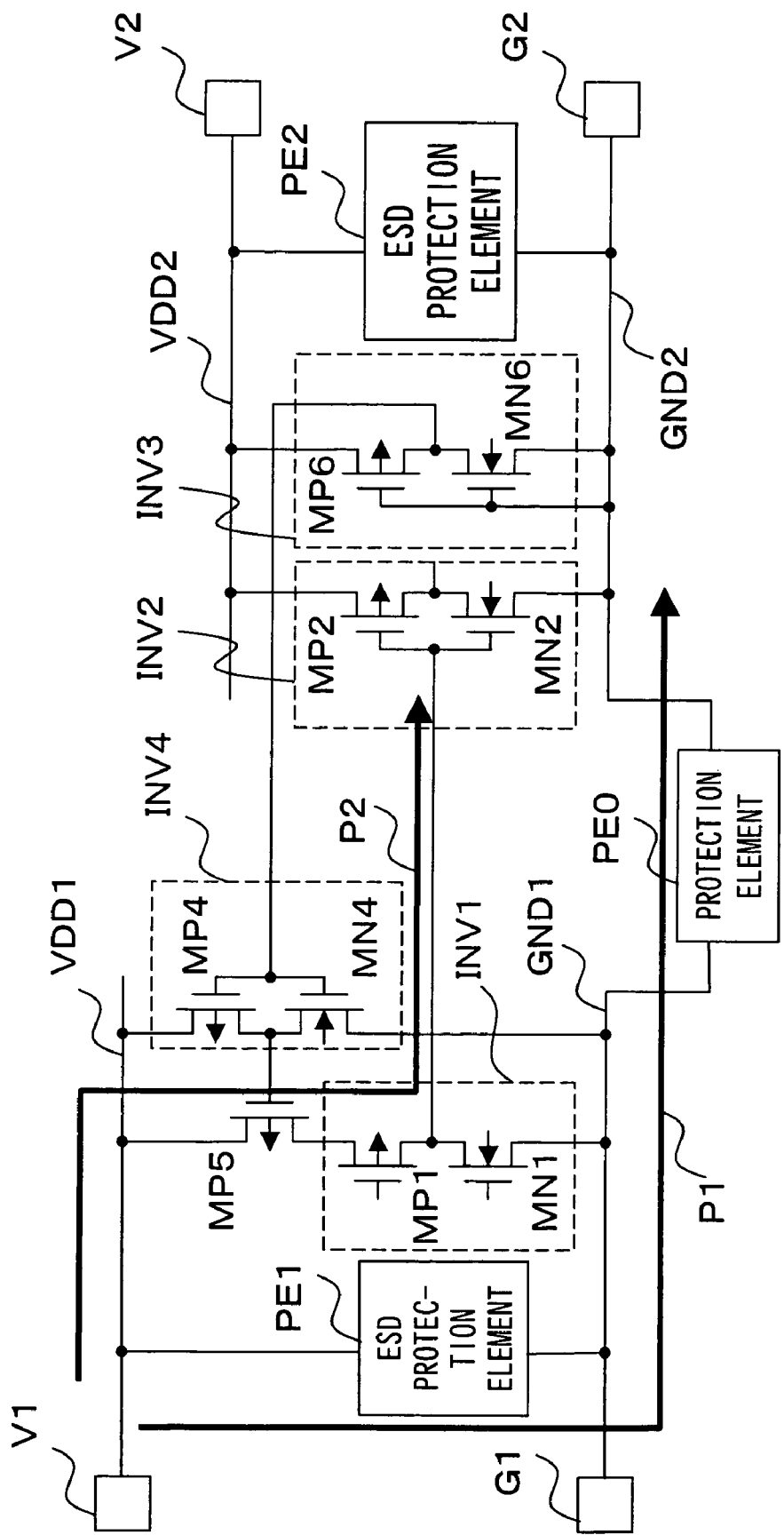
FIG. 1 is a circuit block diagram of a semiconductor unit relating to a first embodiment of the present invention.

A semiconductor unit relating to an embodiment of the present invention comprises an output circuit (INV1 in FIG. 1), an input circuit (INV2 in FIG. 1), and a switching element (MP5 in FIG. 1). In order to receive power from a first power supply, the output circuit is connected to first ground wiring i.e., ground wiring (GND1 in FIG. 1) supplying ground potential to a circuit to which power is supplied by the first power supply, and to first power supply wiring (VDD1 in FIG. 1) via the switching element (MP5 in FIG. 1). Further, in order to receive power from a second power supply, the input circuit is connected to second ground wiring i.e., ground wiring (GND2 in FIG. 1) supplying ground potential to a circuit to which power is supplied by the second power supply and to second power supply wiring (VDD2 in FIG. 1), and an input node is connected to an output node of the output circuit. Further, the first ground wiring and the second ground wiring are connected in common directly or via either a resistance element or a protection element (PE0). Further, the switching element is short circuited during normal operation and controlled so that it releases the output circuit from the first power supply wiring when a surge arrives in the first power supply wiring. Hereinafter, a more concrete circuit of the embodiment and its variations will be described in detail.

Embodiment 1

FIG. 1 is a circuit block diagram of a semiconductor unit relating to a first embodiment of the present invention. In FIG. 1, a first power supply system comprises a power supply terminal V1 and a ground terminal G1, and a second power supply system comprises a power supply terminal V2 and a ground terminal G2. The first power supply system further comprises an ESD protection element PE1, the inverter circuit INV1, the PMOS transistor MP5 subordinately connected to the inverter circuit INV1, and an inverter circuit INV4. The second power supply system comprises an ESD protection element PE2, the inverter circuit INV2, and an inverter circuit INV3. Further, the ground terminal G1 and the ground terminal G2 are connected via the protection element PE0.

First, explanations on the circuits belonging to the first power supply system will be made. The inverter circuit INV1 is constituted by a PMOS transistor MP1 and an NMOS transistor MN1, which are subordinately connected. The source of the PMOS transistor MP1 is connected to the drain of the PMOS transistor MP5, and the source of the PMOS transistor MP5 is connected to the power supply terminal V1 via the power supply wiring VDD1. The drain of the PMOS transistor MP1 is connected to the drain of the NMOS transistor MN1, becomes the output node of the inverter circuit INV1, and is connected to the input node of the inverter circuit INV2. The source of the NMOS transistor MN1 is connected to the ground terminal G1 via the ground wiring GND1. The gate terminals of the PMOS transistor MP1 and the NMOS transistor MN1 are respectively connected to a prescribed circuit element (not shown in the drawing) belonging to the first power supply system.

The inverter circuit INV4 is constituted by a PMOS transistor MP4 and an NMOS transistor MN4, which are subordinately connected. The source of the PMOS transistor MP4 is connected to the power supply terminal V1 via the power supply wiring VDD1. The drain of the PMOS transistor MP4 is connected to the drain of the NMOS transistor MN4, becomes an output node of the inverter circuit INV4, and is connected to the gate of the PMOS transistor MP5. The source of the NMOS transistor MN4 is connected to the ground terminal G1 via the ground wiring GND1. The gates of the PMOS transistor MP4 and the NMOS transistor MN4 are connected in common to an output node of the inverter circuit INV3.

Figure 2:
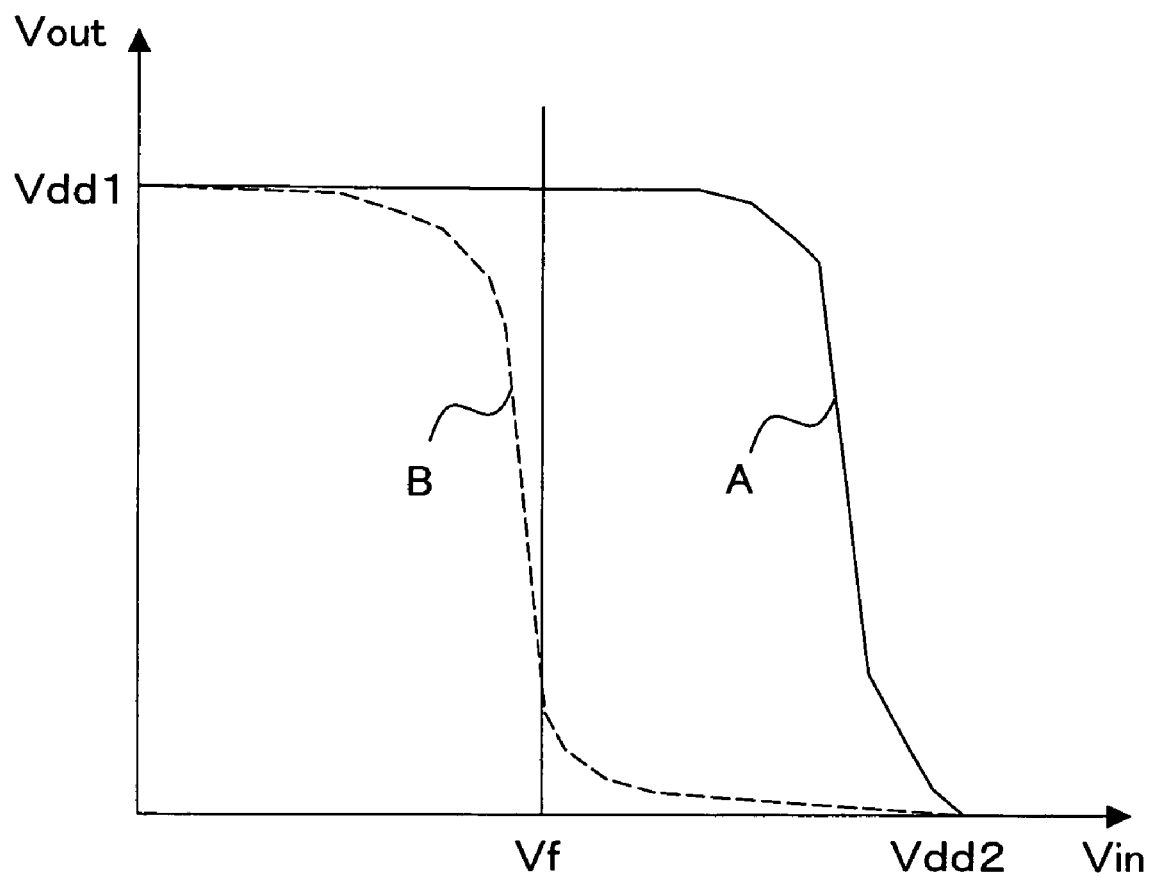
FIG. 2 is a drawing illustrating the input/output characteristics of the inverter circuit INV4.

The input/output characteristics of the inverter circuit INV4 will be described. FIG. 2 is a drawing showing the input/output characteristics of the inverter circuit INV4, which is illustrated by a characteristic curve A. As will be explained later, during normal operation, a voltage Vin of the input node of the inverter circuit INV4 is equal to a voltage Vdd2 of the power supply terminal V2, and a voltage Vout of the output node is almost zero. In the case where the power supply terminal V2 is floating when ESD is applied, the voltage Vin of the input node of the inverter circuit INV4 becomes a voltage Vf and the voltage Vout of the output node becomes almost a voltage Vdd1. A characteristic curve B illustrates the input/output characteristics of a general inverter circuit. In the characteristic curve B, when the input node is floating, it is not guaranteed that an output signal always reaches the voltage Vdd1, therefore it is preferable that the threshold value be set high in the inverter circuit INV4 as shown by the characteristic curve A.

Next, the circuits belonging to the second power supply system will be described. The inverter circuit INV2 is constituted by a PMOS transistor MP2 and an NMOS transistor MN2, which are subordinately connected. The source of the PMOS transistor MP2 is connected to the power supply terminal V2 via the power supply wiring VDD2. The drain of the PMOS transistor MP2 is connected to the drain of the NMOS transistor MN2, becomes an output node of the inverter circuit INV2, and is connected to a prescribed circuit element (not shown in the drawing) belonging to the second power supply system. The source of the NMOS transistor MN2 is connected to the ground terminal G2 via the ground wiring GND2. The gates of the PMOS transistor MP2 and the NMOS transistor MN2 are connected to the output node of the inverter circuit INV1.

The inverter circuit INV3 is constituted by a PMOS transistor MP6 and an NMOS transistor MN6, which are subordinately connected. The source of the PMOS transistor MP6 is connected to the power supply terminal V2 via the power supply wiring VDD2. The drain of the PMOS transistor MP6 is connected to the drain of the NMOS transistor MN6, constituting an output node of the inverter circuit INV3, which is connected to the input node of the inverter circuit INV4. The source of the NMOS transistor MN6 is connected to the ground terminal G2 via the ground wiring GND2. The gates of the PMOS transistor MP6 and the NMOS transistor MN6 are connected in common to the ground terminal G2 via the ground wiring GND2.

Note that the positions of the inverter circuits INV1, INV2, INV3, and INV4 are not limited to the inverter circuit, but logic gate circuits such as NAND gates, NOR gates, flip-flop circuits, and level shifters may be used to constitute similar circuits. Further, the power supply wiring VDD1 and the power supply wiring VDD2 do not need to have the same voltage, and one may be higher than the other.

In the structure described above, during normal operation, the potential of the power supply wiring VDD2 is supplied to the gate potentials of the PMOS transistor MP4 and the NMOS transistor MN4 from the inverter circuit INV3 made up of the NMOS transistor MN6 and the PMOS transistor MP6, and the inverter circuit INV4 supplies the potential of the ground wiring GND1 to the gate of the PMOS transistor MP5. As a result, the PMOS transistor MP5 becomes an on state, enabling the inverter circuit INV1 to send a signal to the inverter circuit INV2.

When ESD is applied, assuming the ground terminal G2 is grounded and a positive electric charge is applied to the power supply terminal V1, the potential of the power supply wiring VDD2 is placed in a floating state. Because of this, the inverter circuit INV4 supplies the potential of the power supply wiring VDD1 to the gate of the PMOS transistor MP5, and the PMOS transistor MP5 is turned off. Therefore, the potential of the power supply wiring VDD1 is applied and the current charged in the gates of the PMOS transistor MP2 and the NMOS transistor MN2 (a path P2) stops flowing. Before a voltage that might damage the gate electrodes of the PMOS transistor MP2 and the NMOS transistor MN2 is reached, the ESD protection element PE1 and the protection element PE0 discharge the electric charge through the ground wiring GND1 and the ground wiring GND2 (a path P1) and prevent the PMOS transistor MP2 and the NMOS transistor MN2 from being damaged.

Figure 3:
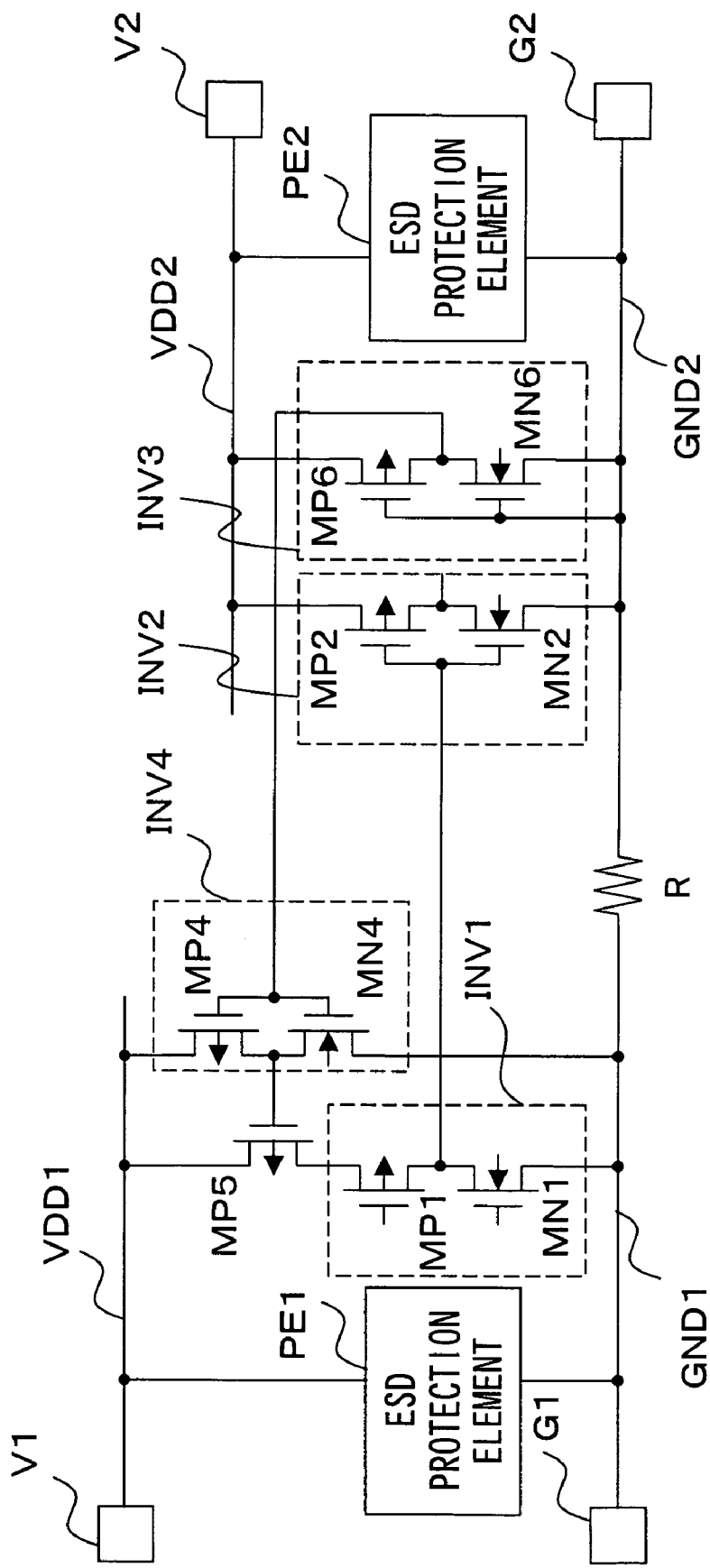
FIG. 3 is a circuit block diagram of a case where a resistance element is inserted between the ground wirings in the first embodiment of the present invention.
Figure 4:
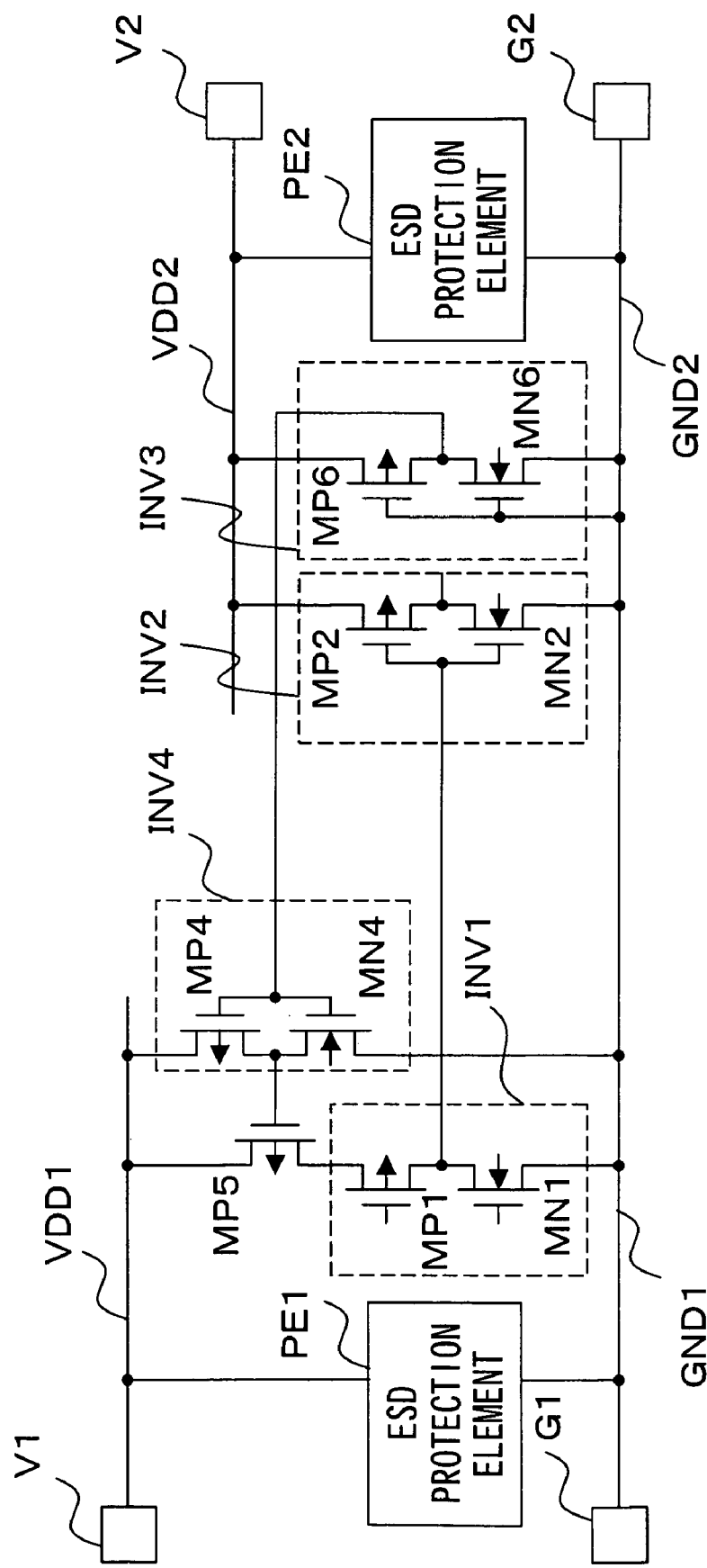
FIG. 4 is a circuit block diagram of a case where the ground wirings are short circuited in the first embodiment of the present invention.

Further, the protection element PE0 is inserted between the ground wiring GND1 and the ground wiring GND2 in FIG. 1, however, the protection method of the present invention can be applied by inserting a resistance element R between the ground wiring GND1 and the ground wiring GND2 as shown in FIG. 3 or short circuiting the ground wiring GND1 and the ground wiring GND2 with wiring (including the wire resistance of the wiring short circuiting) as shown in FIG. 4.

Figure 5:
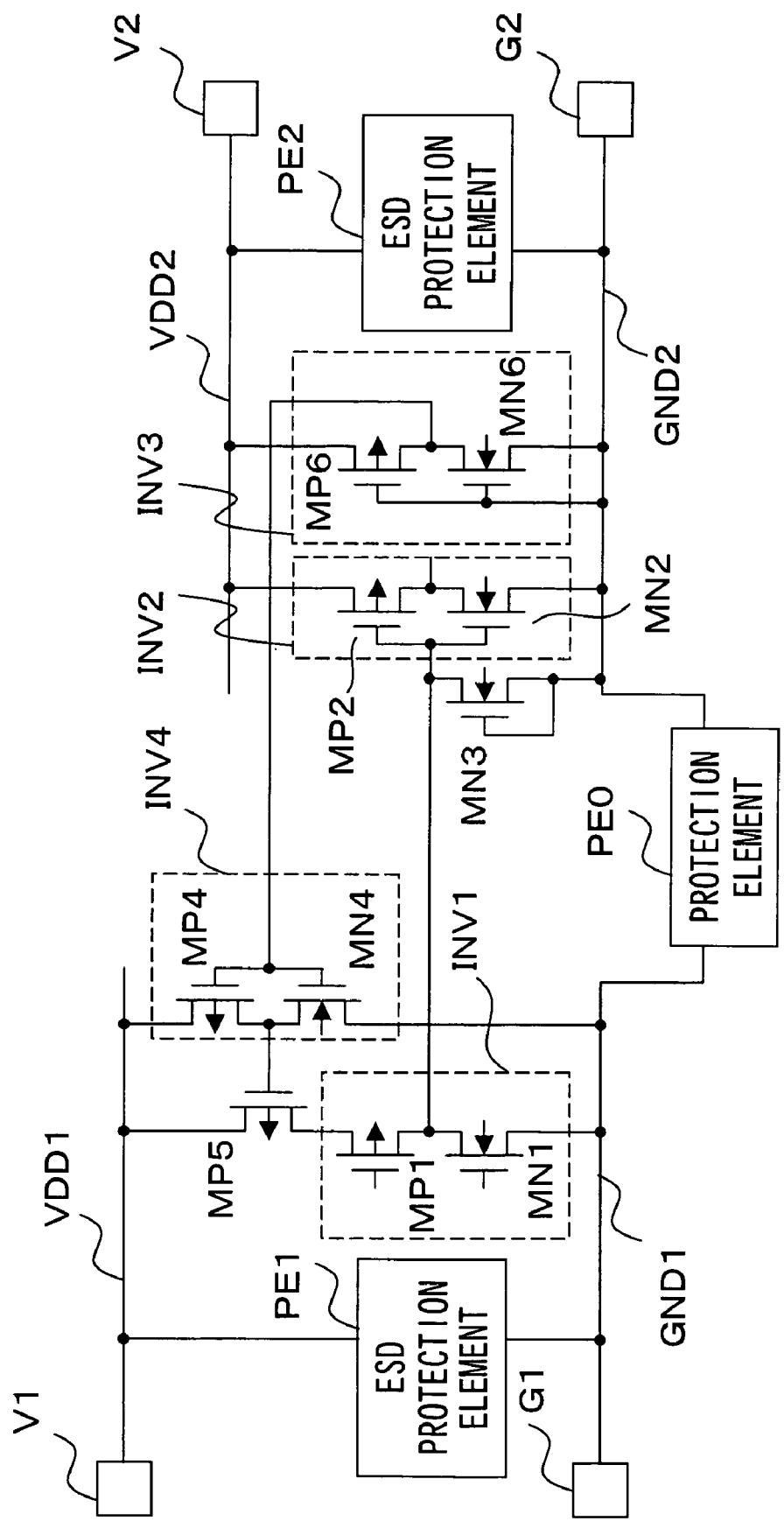
FIG. 5 is a circuit block diagram of a case where a gate protection element is added at the input of the inverter circuit INV2 in the first embodiment of the present invention.

Further, FIG. 5 is a block diagram of a circuit where an NMOS transistor MN3 as a gate protection element is added at the input of the inverter circuit INV2. In FIG. 5, the drain of the NMOS transistor MN3 is connected to the gates of the NMOS transistor MN2 and the PMOS transistor MP2, and the source and gate of the NMOS transistor MN3 are connected to the ground wiring GND2. The NMOS transistor MN3 becomes conductive when a voltage higher than or equal to a prescribed value is applied, and prevents an excessive amount of voltage from being applied to the gates of the NMOS transistor MN2 and the PMOS transistor MP2. In addition to the fact that the PMOS transistor MP5 is turned off when ESD is being applied, this improves the protection against ESD at the input node of the inverter circuit INV2. Note that, instead of the NMOS transistor MN3, the gate protection element may be constituted by any element such as a diode that becomes conductive when a voltage higher than or equal to a prescribed value is applied.

Figure 6:
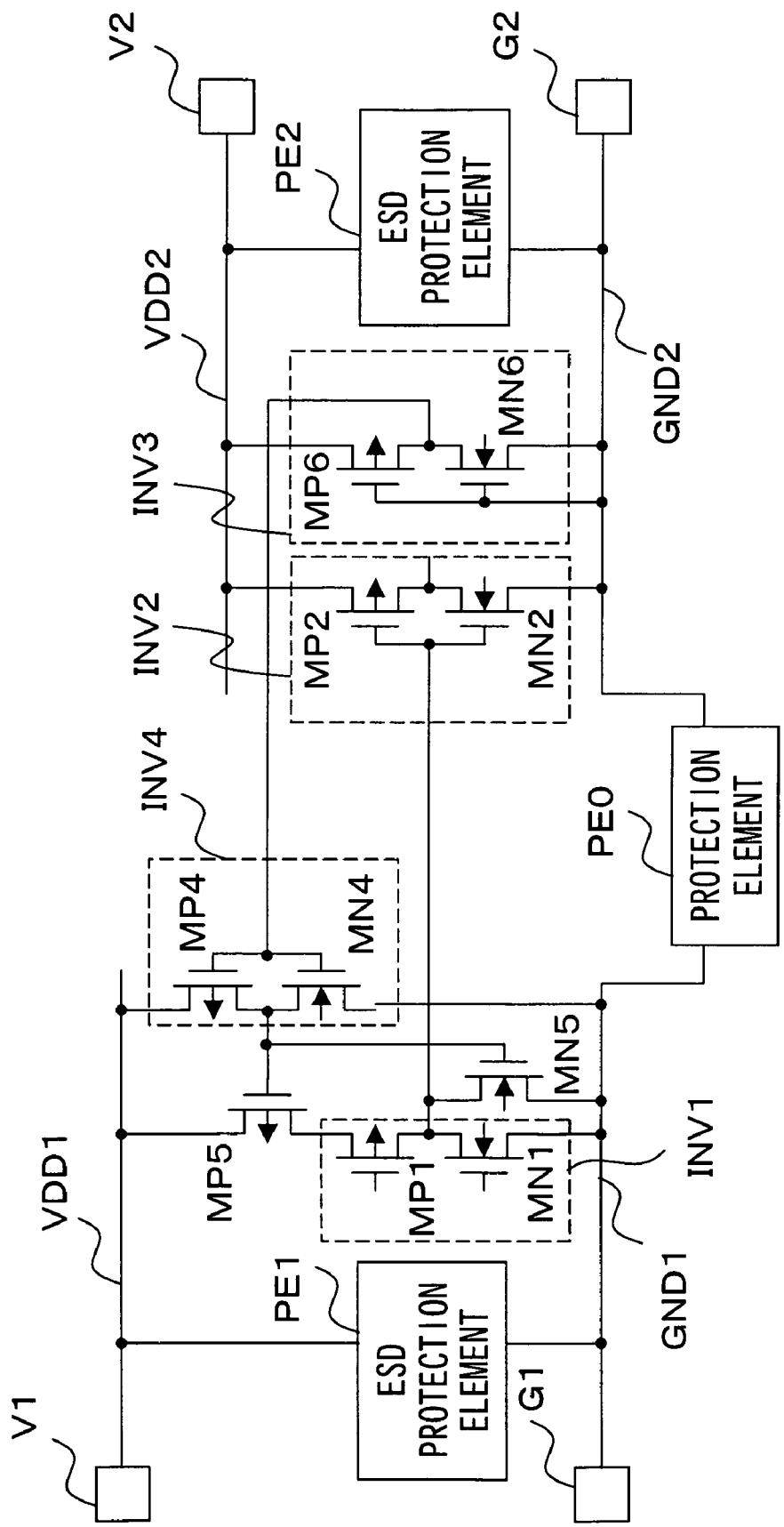
FIG. 6 is a circuit block diagram of a case where a switching element is added at the output of the inverter circuit INV1 in the first embodiment of the present invention.

Further, FIG. 6 is a block diagram of a circuit where an NMOS transistor MN5 is added at the output node of the inverter circuit INV1 shown in FIG. 1. In FIG. 6, the drain of the NMOS transistor MN5 is connected to the output node of the inverter circuit INV1, its source is connected to the ground wiring GND1, and its gate is connected to the output node of the inverter circuit INV4. During normal operation, the NMOS transistor MN5 is turned off and does not influence the signal transmission from the inverter circuit INV1 to the inverter circuit INV4. Since the power supply wiring VDD2 is placed in a floating state when ESD is applied, the NMOS transistor MN5 is turned on and the PMOS transistor MP5 is turned off. The ESD protection of the PMOS transistor MP2 and the NMOS transistor MN2 improves more because the potential of the input node of the inverter circuit INV2 can be kept even lower.

Figure 7:
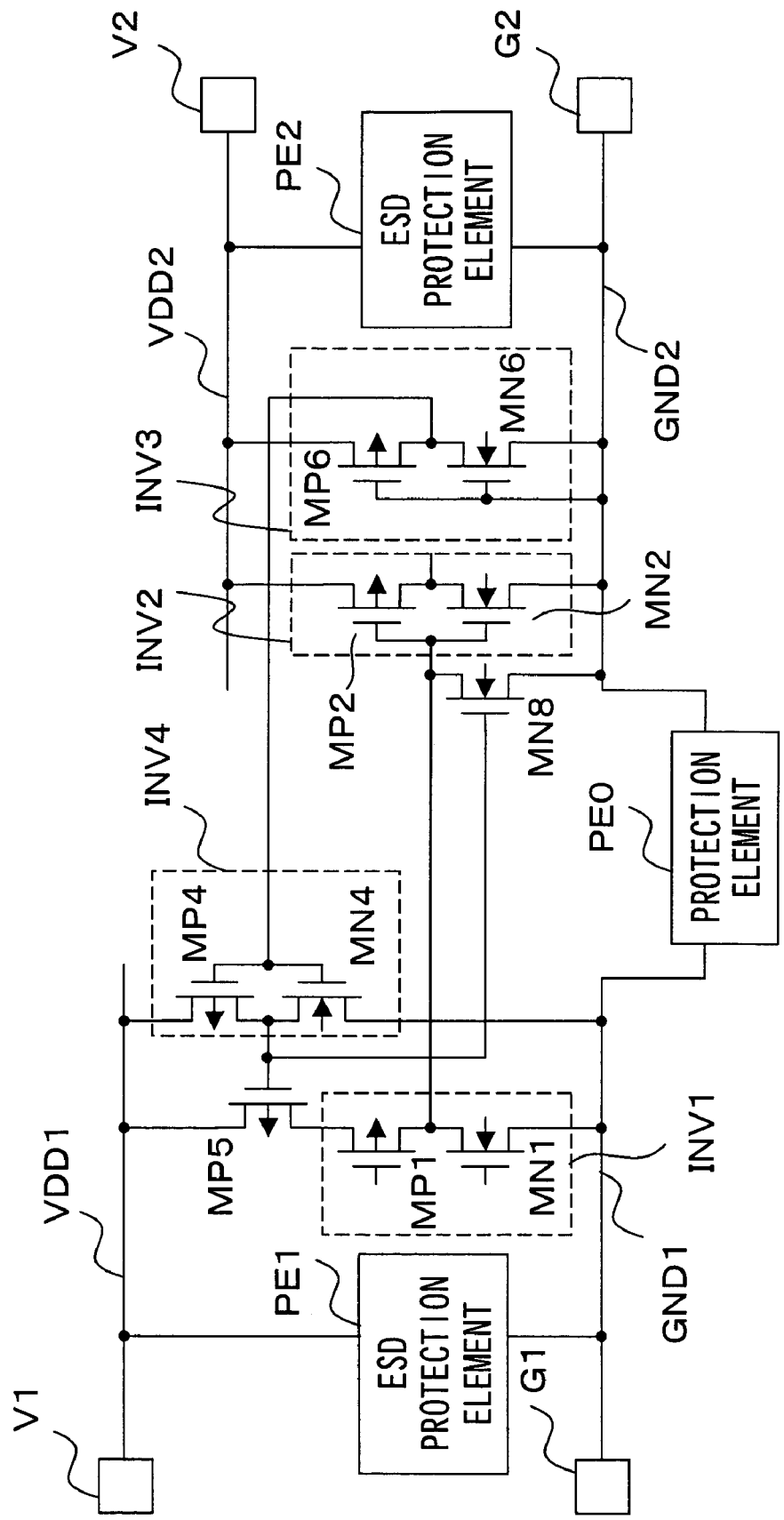
FIG. 7 is a circuit block diagram of a case where a switching element is added at the input of the inverter circuit INV2 in the first embodiment of the present invention.

Further, FIG. 7 is a block diagram of a circuit where an NMOS transistor MN8 is added at the input node of the inverter circuit INV2 shown in FIG. 1. In FIG. 7, the drain of the NMOS transistor MN8 is connected to the input node of the inverter circuit INV2, its source is connected to the ground wiring GND2, and its gate is connected to the output node of the inverter circuit INV4. During normal operation, the NMOS transistor MN8 is turned off and does not influence the signal transmission from the inverter circuit INV1 to the inverter circuit INV4. Since the power supply wiring VDD2 is placed in a floating state when ESD is applied, the NMOS transistor MN8 is turned on and the PMOS transistor MP5 is turned off. The ESD protection of the PMOS transistor MP2 and the NMOS transistor MN2 improves more because the potential of the input node of the inverter circuit INV2 can be kept even lower.

Further, when ESD is applied by the power supply wiring VDD2 to the ground wiring GND1 in Embodiment 1, an electric charge might get injected into the input node of the inverter circuit INV4 and it might damage it. Therefore, it is preferable that a countermeasure such as inserting a resistance element between an output terminal of the inverter circuit INV3 and an input terminal of the inverter circuit INV4 or using an element with good gate oxide integrity for the PMOS transistor MP4 and the NMOS transistor MN4, which constitute the inverter circuit INV4, be employed. Since the inverter circuit INV4 is not used for high-speed signal transmission, there is no problem in increasing the resistance of the wiring between the inverter circuit INV4 and the inverter circuit INV2.

In the above explanation, it is assumed that the power supply wiring VDD1 and the power supply wiring VDD2 belong to different power supply systems and are separated. However, even when the power supply wiring VDD1 and the power supply wiring VDD2 belong to the same power supply system and ESD is applied to the power supply terminal V1, the ESD protection of the circuit on the input side similarly improves. In other words, the PMOS transistor MP5 is turned off, and the current charged in the gates of the PMOS transistor MP2 and the NMOS transistor MN2 stops flowing. This prevents the PMOS transistor MP2 and the NMOS transistor MN2 from being damaged. However, it is still preferable that the inverter circuit INV3 be connected to a different power supply system even when this is applied within the same power supply. It is because, with other power supply systems floating, the inverter circuit INV4 supplies the potential of the power supply wiring VDD1 to the gate of the PMOS transistor MP5 and the PMOS transistor MP5 is reliably turned off.

Embodiment 2

Figure 8:
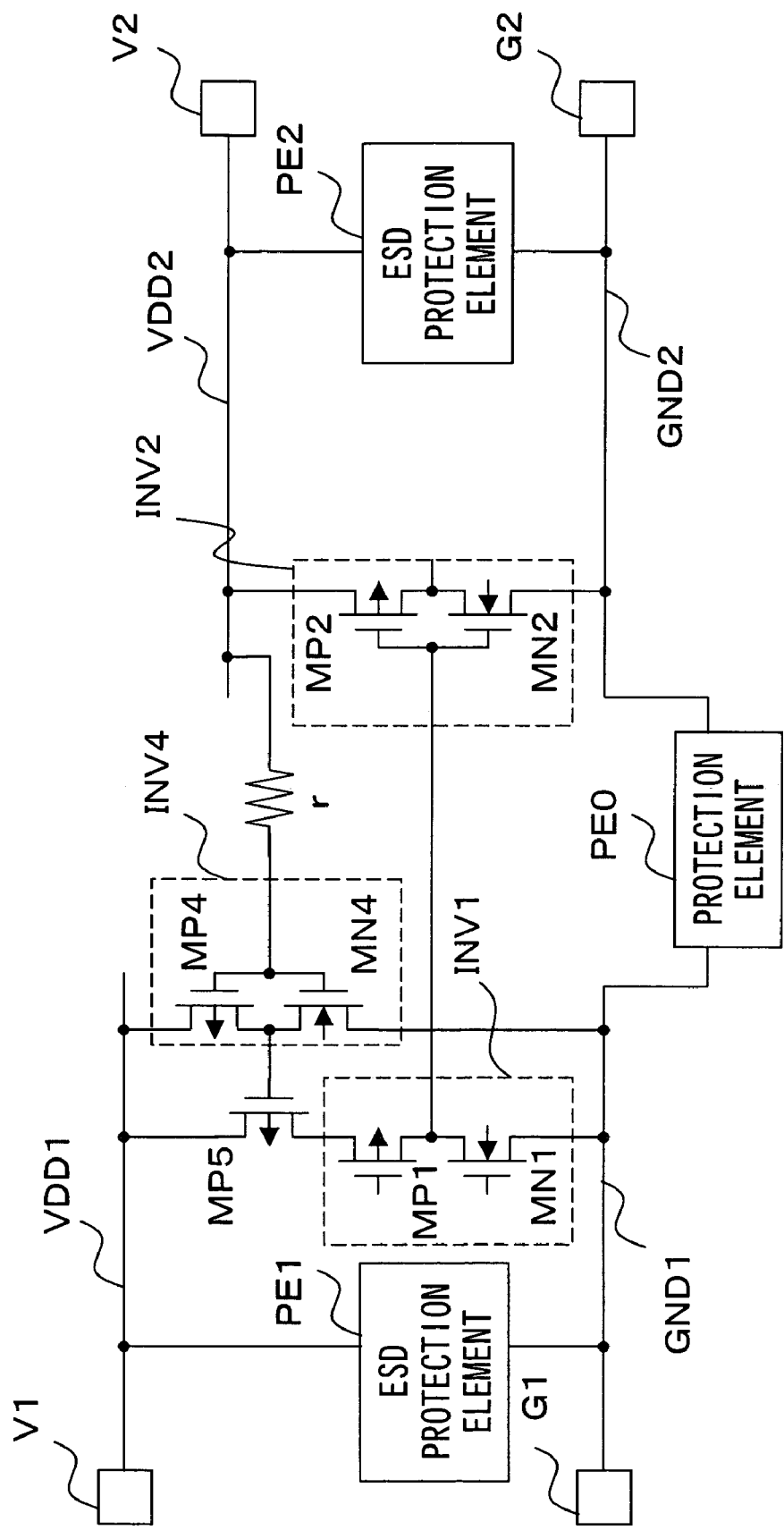
FIG. 8 is a circuit block diagram of a semiconductor unit relating to a second embodiment of the present invention.

FIG. 8 is a circuit block diagram of a semiconductor unit relating to a second embodiment of the present invention. In FIG. 8, the symbols same as the ones in FIG. 1 indicates the same things, thus explanations of them will be omitted. The difference between FIG. 8 and FIG. 1 is that the inverter circuit INV3 shown in FIG. 1 is omitted and the input node of the inverter circuit INV4 is connected to the power supply wiring VDD2 via a resistance r. Since the power supply wiring VDD2 is placed in a floating state when ESD is applied as in Embodiment 1, the inverter circuit INV4 supplies the potential of the power supply wiring VDD1 to the gate of the PMOS transistor MP5 as indicated by the characteristics in FIG. 2, and the PMOS transistor MP5 is turned off. Therefore, the injection of an electric charge, which occurs when ESD is applied, into the input node of the inverter circuit INV2 is prevented, and the ESD protection of the inverter circuit INV2 is improved.

Embodiment 3

Figure 9:
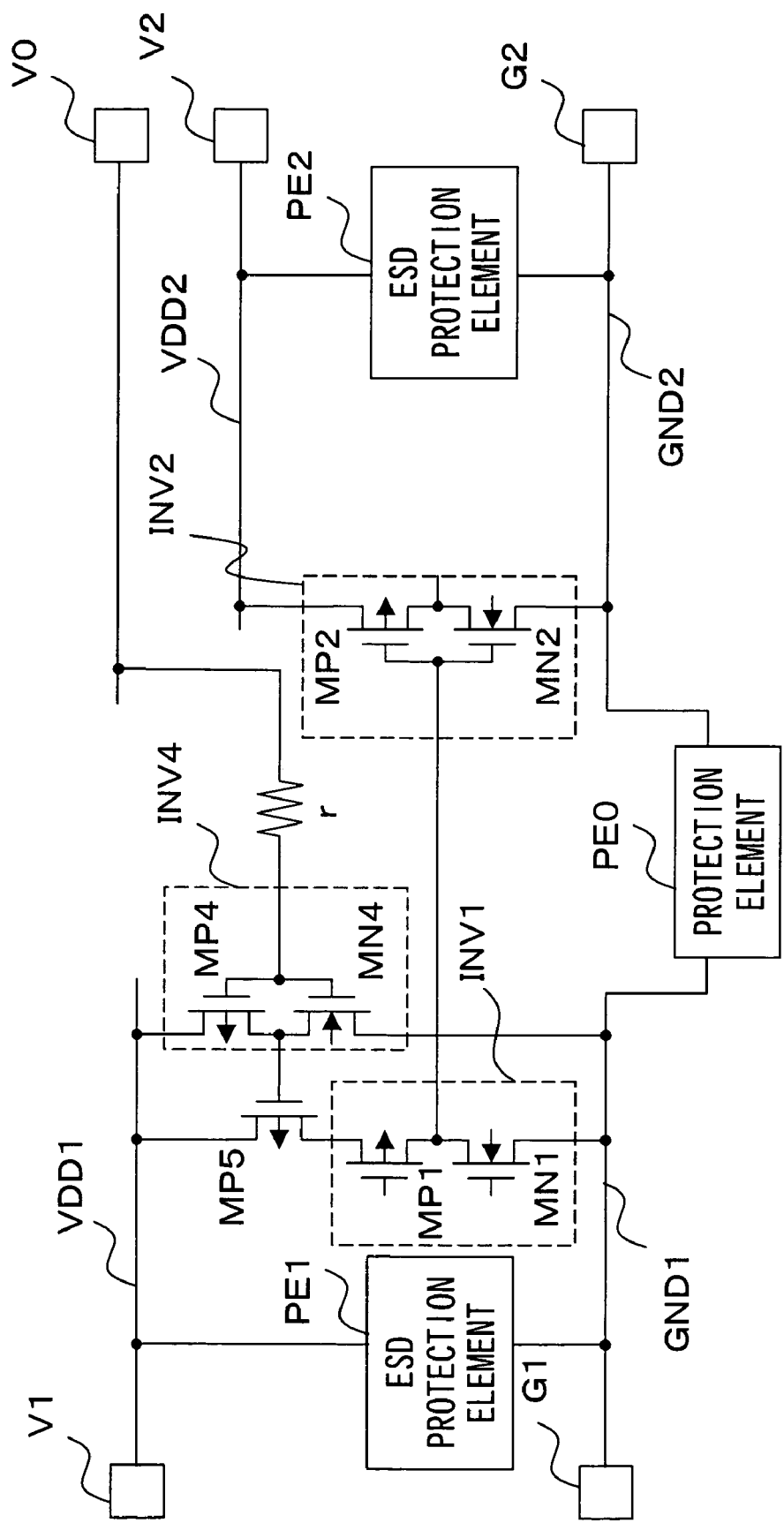
FIG. 9 is a circuit block diagram of a semiconductor unit relating to a third embodiment of the present invention.

FIG. 9 is a circuit block diagram of a semiconductor unit relating to a third embodiment of the present invention. In FIG. 9, the symbols same as the ones in FIG. 1 indicates the same things, thus explanations of them will be omitted. The difference between FIG. 9 and FIG. 1 is that the inverter circuit INV3 shown in FIG. 1 is omitted, and the input node of the inverter circuit INV4 is connected to a terminal V0 via a resistance element r. The terminal V0 does not belong to the first power supply system (comprising the power supply terminal V1) or the second power supply system (comprising the power supply terminal V2), a prescribed power supply voltage is supplied to it during normal operation, and it is floating when ESD is applied. When ESD is applied, the power supply V0 is placed in a floating state, the inverter circuit INV4 supplies the potential of the power supply wiring VDD1 to the gate of the PMOS transistor MP5 as in Embodiment 2, and the PMOS transistor MP5 is turned off. Therefore, the injection of an electric charge, which occurs when ESD is applied, into the input node of the inverter circuit INV2 is prevented, and the ESD protection of the inverter circuit INV2 is more improved.

Embodiment 4

Figure 10:
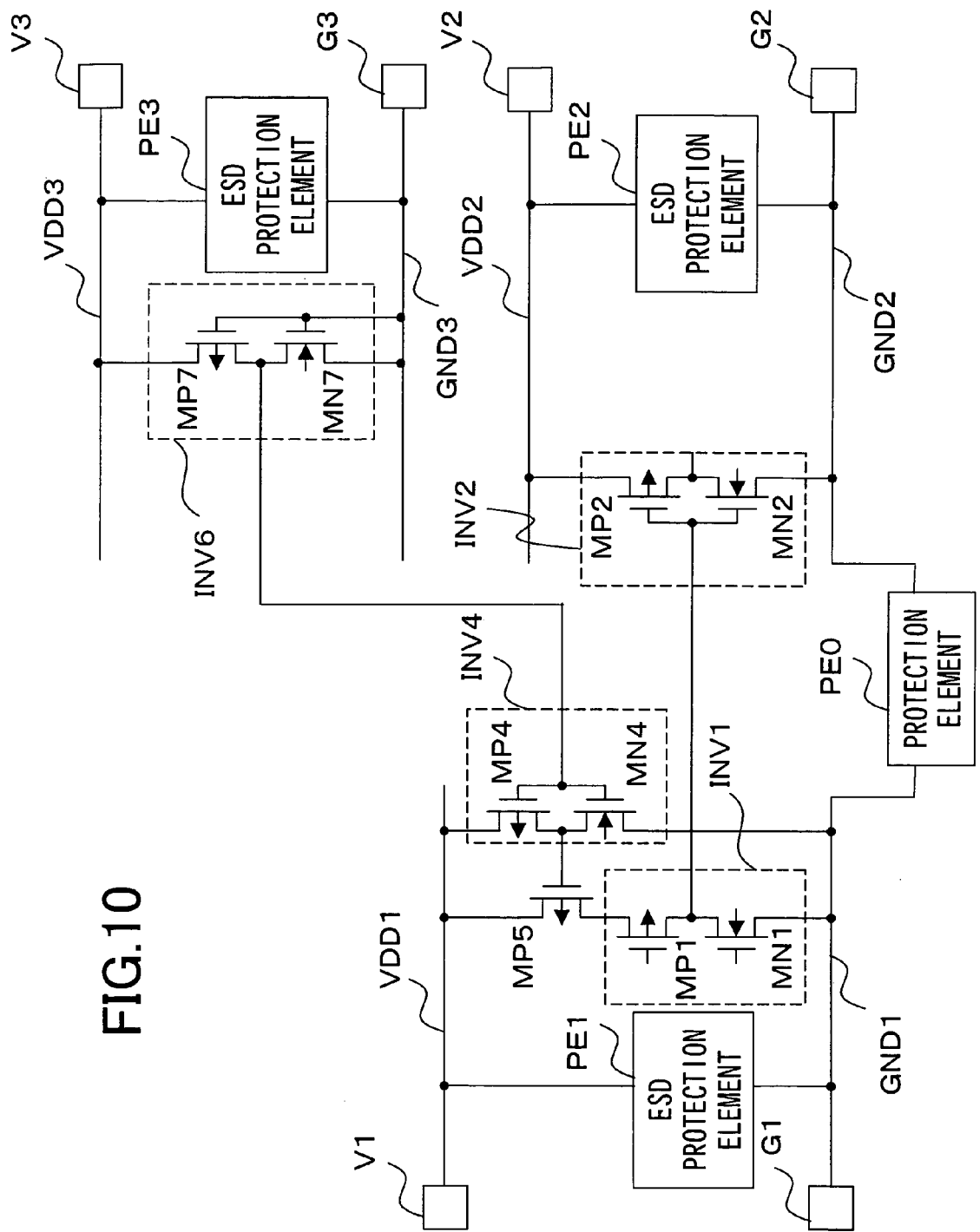
FIG. 10 is a circuit block diagram of a semiconductor unit relating to a fourth embodiment of the present invention.

FIG. 10 is a circuit block diagram of a semiconductor unit relating to a fourth embodiment of the present invention. In FIG. 10, the symbols same as the ones in FIG. 1 indicates the same things, thus explanations of them will be omitted. In FIG. 10, the inverter circuit INV3 shown in FIG. 1 is omitted and a third power supply system comprising a power supply terminal V3 and a ground terminal G3 is newly added. The third power supply system further comprises an ESD protection element PE3 and an inverter circuit INV6. The inverter circuit INV6 is constituted by a PMOS transistor MP7 and an NMOS transistor MN7, which are subordinately connected. The source of the PMOS transistor MP7 is connected to the power supply terminal V3 via power supply wiring VDD3. The drain of the PMOS transistor MP7 is connected to the drain of the NMOS transistor MN7, becomes an output node of the inverter circuit INV6, and is connected to the input node of the inverter circuit INV4. The source of the NMOS transistor MN7 is connected to the ground terminal G3 via ground wiring GND3. The gates of the PMOS transistor MP7 and the NMOS transistor MN7 are connected in common to the ground terminal G3 via the ground wiring GND3.

In the structure described above, a prescribed power supply voltage is supplied to the power supply terminal V3 during normal operation, and it is floating when ESD is applied. When ESD is applied, with the power supply terminal V3 floating, the inverter circuit INV4 supplies the potential of the power supply wiring VDD1 to the gate of the PMOS transistor MP5 as in Embodiment 3, and the PMOS transistor MP5 is turned off. Therefore, the injection of an electric charge, which occurs when ESD is applied, into the input node of the inverter circuit INV2 is prevented, and the ESD protection of the inverter circuit INV2 is improved more.

Embodiment 5

Figure 11:
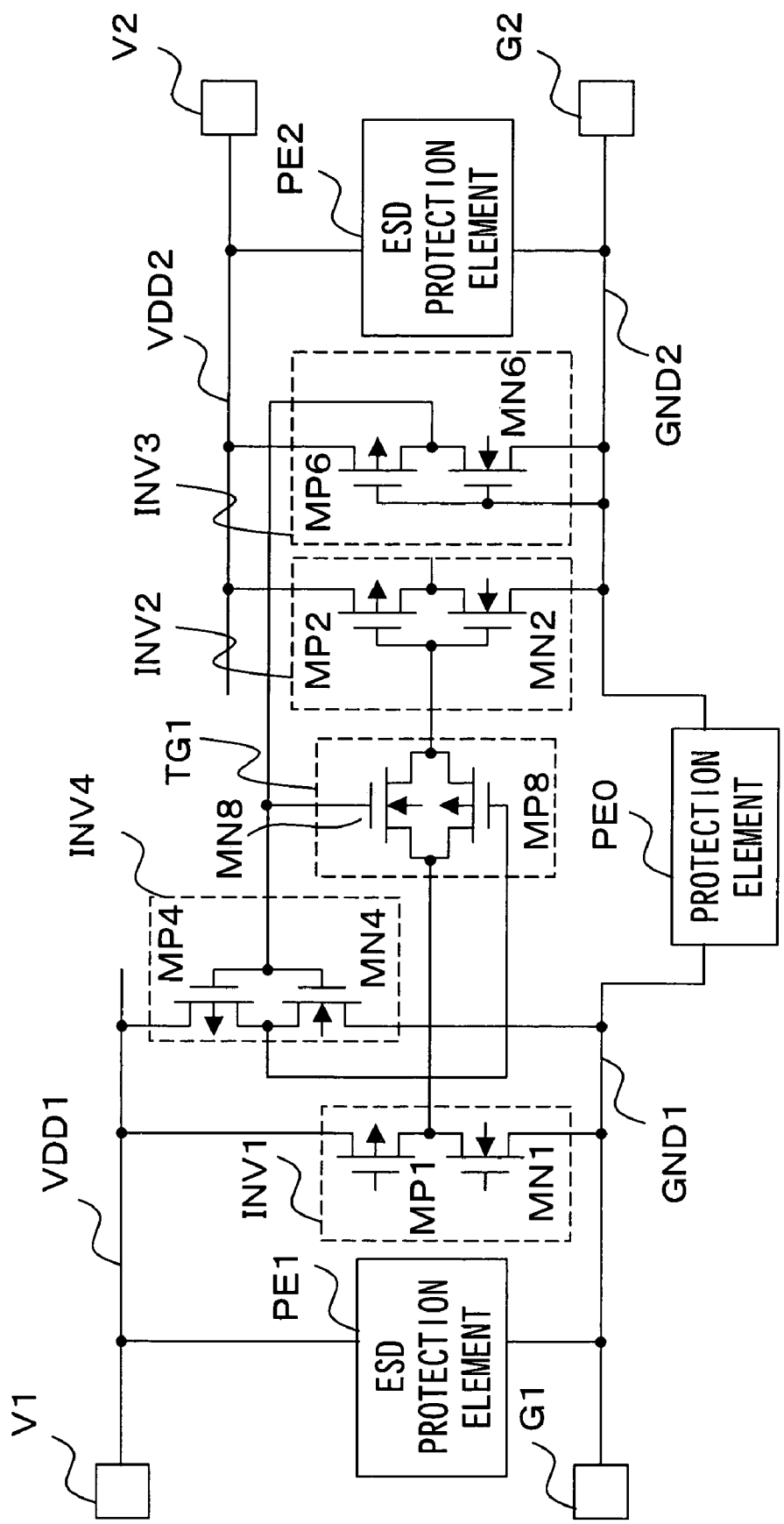
FIG. 11 is a circuit block diagram of a semiconductor unit relating to a fifth embodiment of the present invention.
Figure 12:
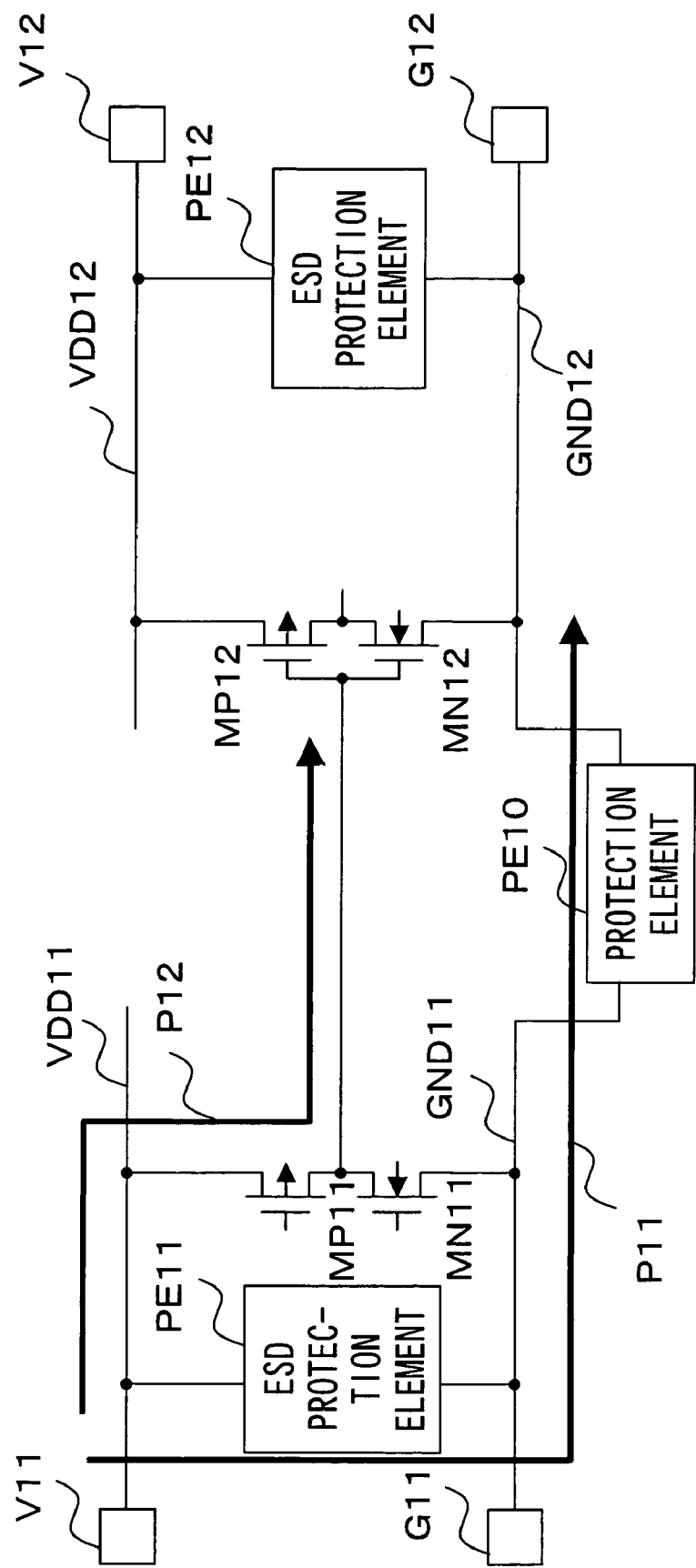
FIG. 12 is a circuit block diagram of a conventional semiconductor unit where a signal is sent/receive between circuits belonging to different power supply systems.
Figure 13:
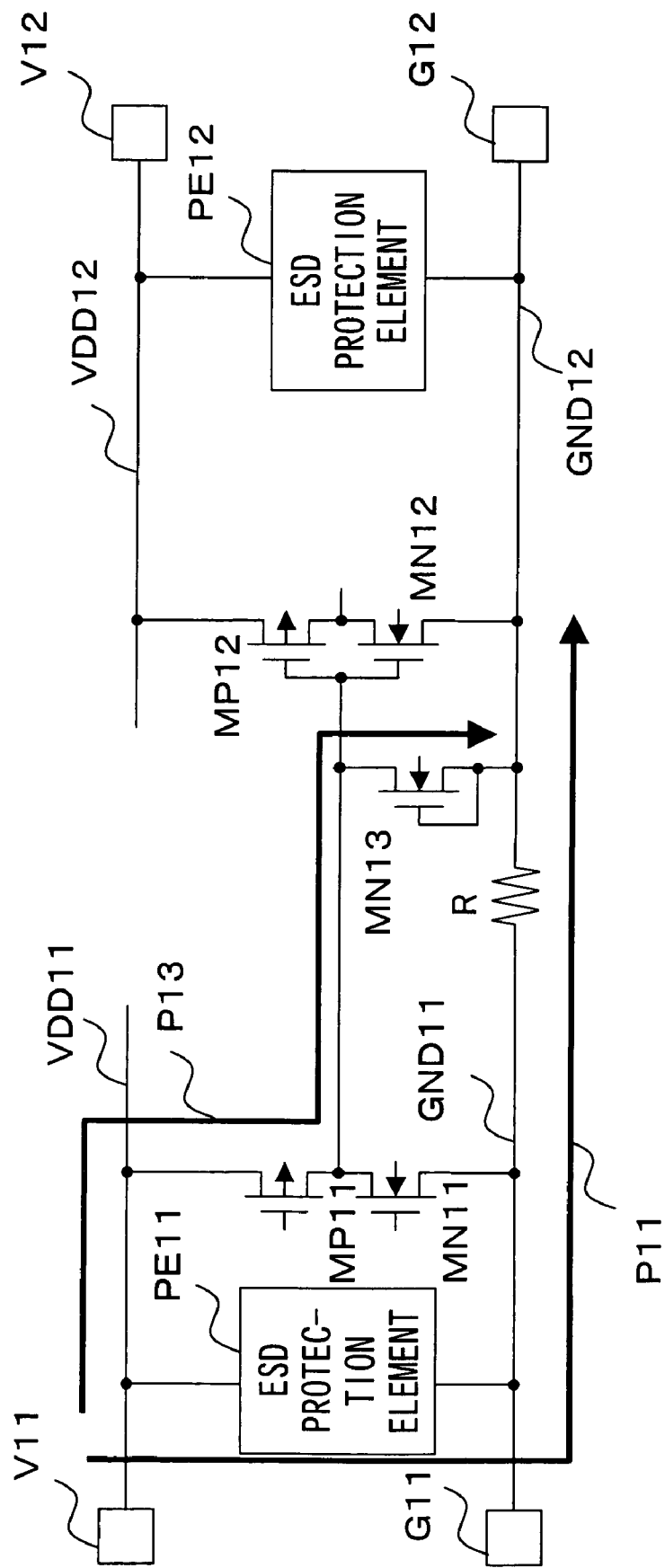
FIG. 13 is a circuit block diagram of another conventional semiconductor unit where a signal is sent/receive between circuits belonging to different power supply systems.

FIG. 11 is a circuit block diagram of a semiconductor unit relating to a fifth embodiment of the present invention. In FIG. 11, the symbols same as the ones in FIG. 1 indicates the same things, thus explanations of them will be omitted. In FIG. 11, the PMOS transistor MP5 shown in FIG. 1 is omitted and a transfer gate TG1 is newly inserted between the output node of the inverter INV1 and the input node of the inverter INV2. The transfer gate TG1 is a switching element made up of an NMOS transistor MN8 and a PMOS transistor MP8, and its one end is connected to the output node of the inverter INV1 and the other end to the input node of the inverter INV2. The gate of the PMOS transistor PN8 is connected to the output node of the inverter INV4, and the gate of the NMOS transistor MN8 is connected to the input node of the inverter INV3 (the input node of the inverter INV4). Further, the source of the PMOS transistor MP1 is directly connected to the power supply wiring VDD1.

In the structure described above, during normal operation, the potential of the power supply wiring VDD2 is supplied to the gate potentials of the PMOS transistor MP4 and the NMOS transistor MN4 from the inverter circuit INV3 made up of the NMOS transistor MN6 and the PMOS transistor MP6, and the NMOS transistor MN8 is turned on. Further, the inverter circuit INV4 supplies the potential of the ground wiring GND1 to the gate of the PMOS transistor MP8. As a result, the PMOS transistor MP8 is turned on. In other words, the transfer gate TG1 becomes on state, enabling the inverter circuit INV1 to send a signal to the inverter circuit INV2.

When ESP is applied, assuming the ground terminal G2 is grounded and a positive electric charge is applied to the power supply terminal V1, the potential of the power supply wiring VDD2 is placed in a floating state. Because of this, the NMOS transistor MN8 is turned off, the inverter circuit INV4 supplies the potential of the power supply wiring VDD1 to the gate of the PMOS transistor MP8, and the PMOS transistor MP8 is turned off (the transfer gate TG1 is in an off-state). Therefore, as in Embodiment 1, even when the potential of the power supply wiring VDD1 is applied, the current charged in the gates of the PMOS transistor MP2 and the NMOS transistor MN2 stops flowing and the PMOS transistor MP2 and the NMOS transistor MN2 are protected from being damaged. By a surge voltage on the power supply wiring VDD1, the inverter circuit INV4 supplies a gate voltage turning the PMOS transistor MP8 of the transfer gate TG1 off. In other words, the inverter circuit INV4 supplies the voltage that occurs when the surge on the power supply wiring VDD1 is detected to the PMOS transistor MP8, making the PMOS transistor MP8 a circuit that cuts off the connection between the power supply path to the inverter circuit INV1 and the signal output path of it.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor unit comprising:
 a first circuit that receives power from a first power supply and has an output node;
 a second circuit that has an input node connected to said output node; and
 a first switching element inserted in a path from power supply wiring of said first power supply through said output node to said input node and short circuited during normal operation, wherein said first switching element detects a surge flowing into said first power supply and cuts off said path.

2. The semiconductor unit as defined in claim 1 wherein said second circuit receives power from a second power supply, and first ground wiring that supplies a ground potential to a circuit that receives power from said first power supply and second ground wiring that supplies a ground potential to a circuit that receives power from said second power supply are connected in common directly or via either a resistor or a first protection element.

3. A semiconductor unit comprising:
 a first circuit that receives power from a first power supply and having an output node;
 a second circuit that receives power from a second power supply and having an input node connected to said output node; and
 a first switching element inserted in a path from power supply wiring of said first power supply through said output node to said input node and short circuited during normal operation, wherein said first switching element opens when either power supply wiring or ground wiring of said second power supply is placed in a floating state.

4. The semiconductor unit as defined in claim 3 wherein ground wiring of said first power supply and the ground wiring of said second power supply are connected in common directly or via either a resistor or a first protection element.

5. The semiconductor unit as defined in claim 1 wherein said first switching element is inserted between the power supply wiring of said first power supply and said first circuit.

6. The semiconductor unit as defined in claim 3 wherein said first switching element is inserted between the power supply wiring of said first power supply and said first circuit.

7. The semiconductor unit as defined in claim 1 wherein said first switching element is inserted between said output node and said input node.

8. The semiconductor unit as defined in claim 3 wherein said first switching element is inserted between said output node and said input node.

9. The semiconductor unit as defined in claim 1 further comprising a second protection element between the power supply wiring of said first power supply and ground wiring of said first power supply.

10. The semiconductor unit as defined in claim 3 further comprising a second protection element between the power supply wiring of said first power supply and ground wiring of said first power supply.

11. The semiconductor unit as defined in claim 1 further comprising a third protection element between said input node and ground wiring of said second power supply.

12. semiconductor unit as defined in claim 3 further comprising a third protection element between said input node and the ground wiring of said second power supply.

13. The semiconductor unit as defined in claim 2 further comprising a second switching element that performs a reverse open/close operation to that of said first switching element between said output node and ground wiring of said first power supply.

14. The semiconductor unit as defined in claim 2 further comprising a second switching element that performs a reverse open/close operation to that of said first switching element between said input node and ground wiring of said second power supply.

15. The semiconductor unit as defined in claim 2 comprising:
- a first inverter circuit that receives power from said first power supply; and
- a second inverter circuit that receives power from said second power supply; wherein
  - said first switching element is an electric field effect transistor;
  - the input of said second inverter circuit is connected to ground wiring of said second power supply, output of said second inverter circuit is connected to input of said first inverter circuit, and output of said first inverter circuit is connected to gate of said electric field effect transistor.

16. The semiconductor unit as defined in claim 2 comprising:
- a first inverter circuit that receives power from said first power supply; wherein
  - said first switching element is an electric field effect transistor;
  - an input of said first inverter circuit is connected to said second power supply, and an output of said first inverter circuit is connected to a gate of said electric field effect transistor.

17. The semiconductor unit as defined in claim 2 comprising:
- a first inverter circuit that receives power from said first power supply; wherein
  - said first switching element is an electric field effect transistor;
  - input of said first inverter circuit is connected to a terminal, to which a prescribed voltage is supplied during normal operation, via a resistor, and output of said first inverter circuit is connected to gate of said electric field effect transistor.

18. The semiconductor unit as defined in claim 2 comprising:
- a first inverter circuit that receives power from said first power supply; and
- a second inverter circuit that receives power from a third power supply; wherein
  - said first switching element is an electric field effect transistor;
  - an input of said second inverter circuit is connected to a ground wiring of said third power supply, an output of said second inverter circuit is connected to an input of said first inverter circuit, and an output of said first inverter circuit is connected to a gate of said electric field effect transistor.

19. The semiconductor unit as defined in claim 15 wherein said electric field effect transistor is turned on during normal operation and is turned off when electrostatic discharge ESD is applied.

* * * * *